(12) United States Patent
Shipe et al.

(10) Patent No.: US 6,773,268 B1
(45) Date of Patent: Aug. 10, 2004

(54) HOLDDOWN FOR CIRCUIT BOARDS

(75) Inventors: Joanne E. Shipe, Harrisburg, PA (US); Tod M. Harlan, Mechanicsburg, PA (US)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/608,162

(22) Filed: Jun. 27, 2003

(51) Int. Cl.[7] .............................................. H01R 12/00
(52) U.S. Cl. .................. 439/74; 439/567; 411/389; 411/551; 411/508; 24/581.1
(58) Field of Search .................. 439/74, 567; 411/389, 411/551, 508; 24/581.1

(56) References Cited

U.S. PATENT DOCUMENTS

| 4,701,984 A | 10/1987 | Wyckoff | |
|---|---|---|---|
| 4,712,939 A | 12/1987 | Fujimoto | |
| 4,966,482 A | 10/1990 | Fujimoto | |
| 5,281,149 A | 1/1994 | Petri | |
| 5,825,630 A | * 10/1998 | Taylor et al. | 361/790 |
| 6,280,202 B1 | * 8/2001 | Alden et al. | 439/66 |

FOREIGN PATENT DOCUMENTS

TW          397274          7/2000

* cited by examiner

Primary Examiner—Truc Nguyen
(74) Attorney, Agent, or Firm—Wei Te Chung

(57) ABSTRACT

A board holddown (1) for holding circuit boards (8,9) includes an elastomeric support member (10) and a bullet-shape member (20) of more rigid material than the support member. The support member includes a first mounting portion (11) for supporting a first circuit board (8), a second mounting portion (12) for supporting a second circuit board (9), and an elongate, thin neck (13) projecting from the second mounting portion. The bullet-shape member is attached to the elongate, thin neck and includes a latch (21). The elongate, thin neck has substantial resilience so that the second circuit board can be easily detached from the board holddown by pushing the bullet-shape member away from its holding position.

6 Claims, 3 Drawing Sheets

HOLDDOWN FOR CIRCUIT BOARDS

BACKGROUND OF THE INVENTION

1. Field of the Invention

The present invention generally relates to a board holddown, and particularly to a board holddown for permanently holding a circuit board and detachably holding another circuit board.

2. Description of Prior Arts

Printed circuit boards are used extensively in various types of electrical equipments. Typically, board holddowns are employed to support and provide spacing for circuit boards. Board holddowns are used, for example, to separate, support and electrically insulate a printed circuit board from either a chassis or other printed circuit boards.

U.S. Pat. Nos. 4,966,482 and 4,712,939 disclose a substrate support of integral construction, by which a substrate can be fixed angularly to and optionally detached from a plate. The support comprises a base, a fixing portion for cooperating with the base and holding the plate therebetween, a first projection extending from the base, and a second projection extending from a wall extending from the base. The end of the substrate can be inserted into the space between the first projection and the second projection and the substrate can be fixed angularly to and optionally detached from the plate. However, particularly referring to FIGS. 6, 10 and 12 of the two patents, it can be readily seen that a plurality of fixation members are put in use together with the support. The fixation members are different in form from the substrate support and facilitate the substrate support to hold the substrate at a distance from the plate. Obviously, a single substrate support of this type without the separate fixation members could not securely hold the substrate and the plate together. Moreover, the integral substrate support is not reliable enough when subjected to vibration, shock, or other horizontally directed force for the wall is substantially perpendicularly formed with the base.

U.S. Pat. No. 4,701,984 discloses another type of board support. The board support comprises a mounting portion for holding a panel and a retainer portion extending beyond the mounting portion for insertion through an aperture of a printed circuit board. The board support also comprises a resilient retaining means adapted to yield upon passage through the aperture in the printed circuit board and thereafter to bear against the opposite surface of the printed circuit board to retain the printed circuit board in supported position spaced from the panel. However, the printed circuit board is easily disengaged from the board support when subjected to an accidentally occurred, vertical force for the board support holds the printed circuit board only through a slight distortion of the resilient retaining means.

Hence, an improved board holddown is highly desired to overcome the disadvantages of the prior art.

BRIEF SUMMARY OF THE INVENTION

Accordingly, it is an object of the present invention to provide a board holddown by which a circuit board can be securely fixed to and easily detached from another circuit board.

In order to achieve the above-mentioned object, a board holddown in accordance with the present invention for fastening circuit boards, comprises an elastomeric support member and a bullet-shape member of more rigid material than the support member. The support member comprises a first mounting portion for supporting a first circuit board, a second mounting portion for supporting a second circuit board, and an elongate, thin neck projecting from the second mounting portion. The bullet-shape member is attached to the elongate, thin neck and comprises a latch abutting against the second circuit board and cooperate with the second mounting portion to thereby retain the second circuit board therebetween. The elongate, thin neck has substantial resilience so that the second circuit board can be easily detached from the board holddown by pushing the bullet-shape member away from its holding position.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
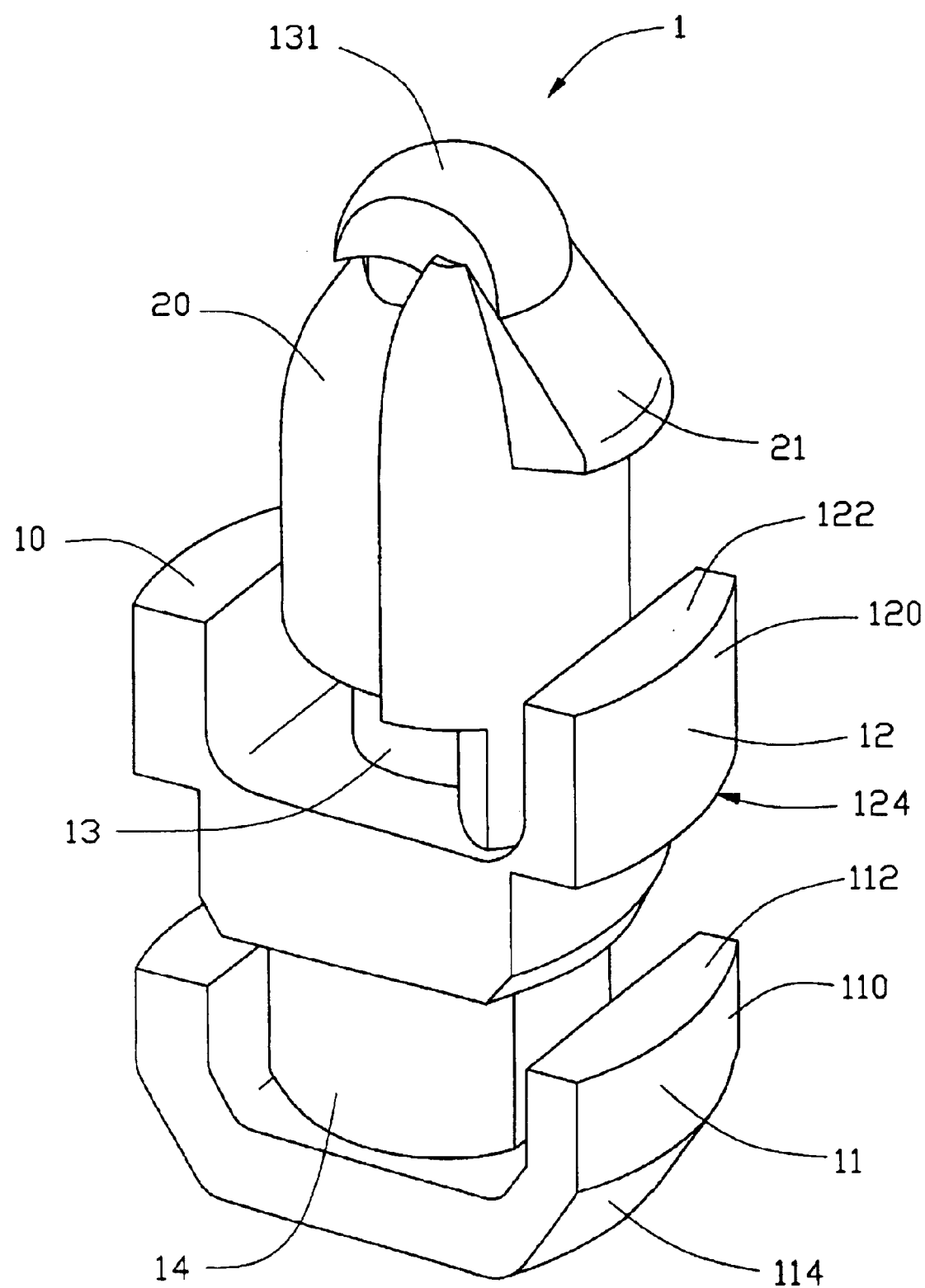
FIG. 1 is a perspective view of a board holddown in accordance with the present invention.

Reference will now be made to the drawing figures to describe the present invention in detail.

Figure 2:
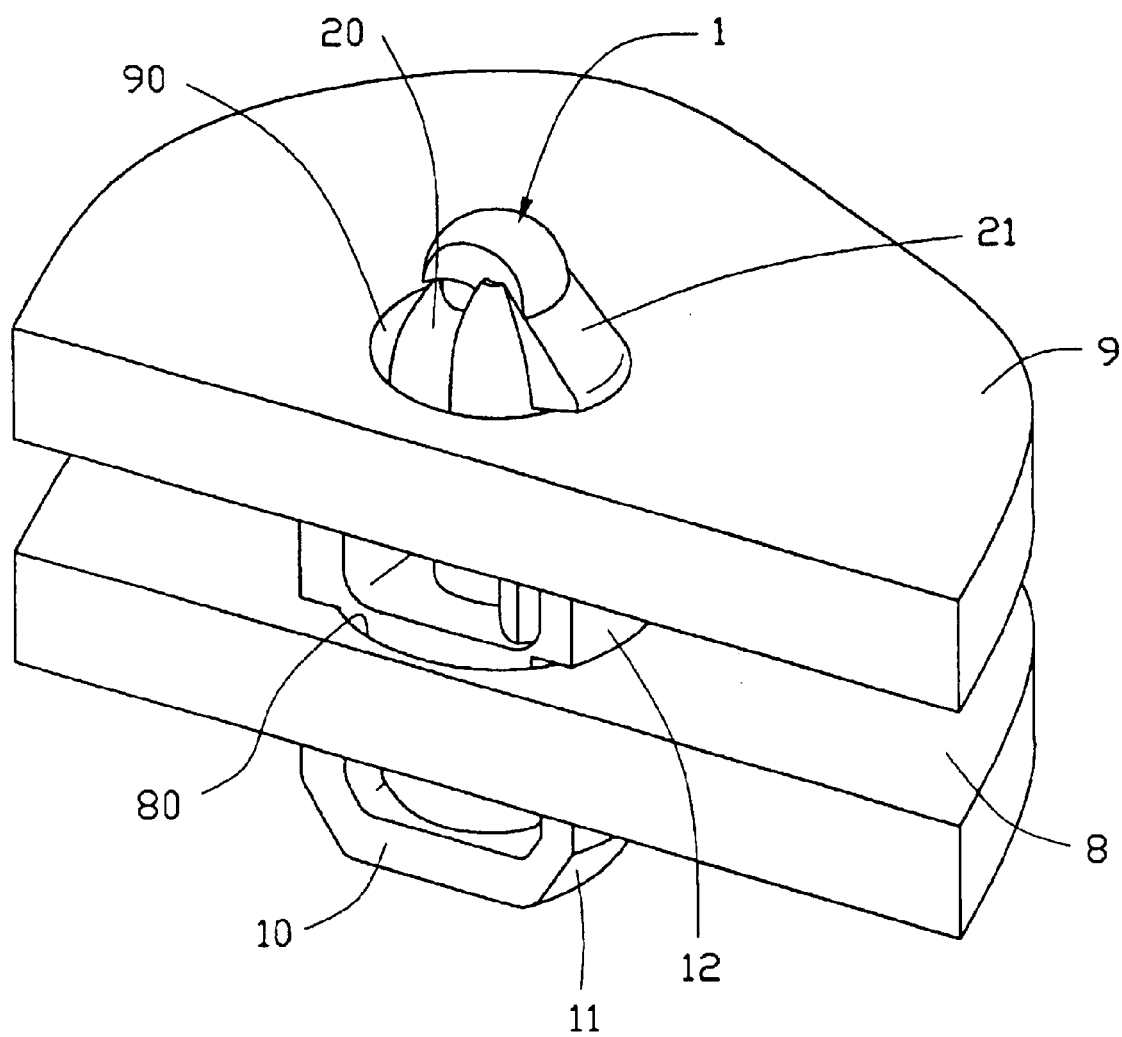
FIG. 2 is a perspective view of the board holddown showing the board holddown holds a first and a second circuit boards together.
Figure 3:
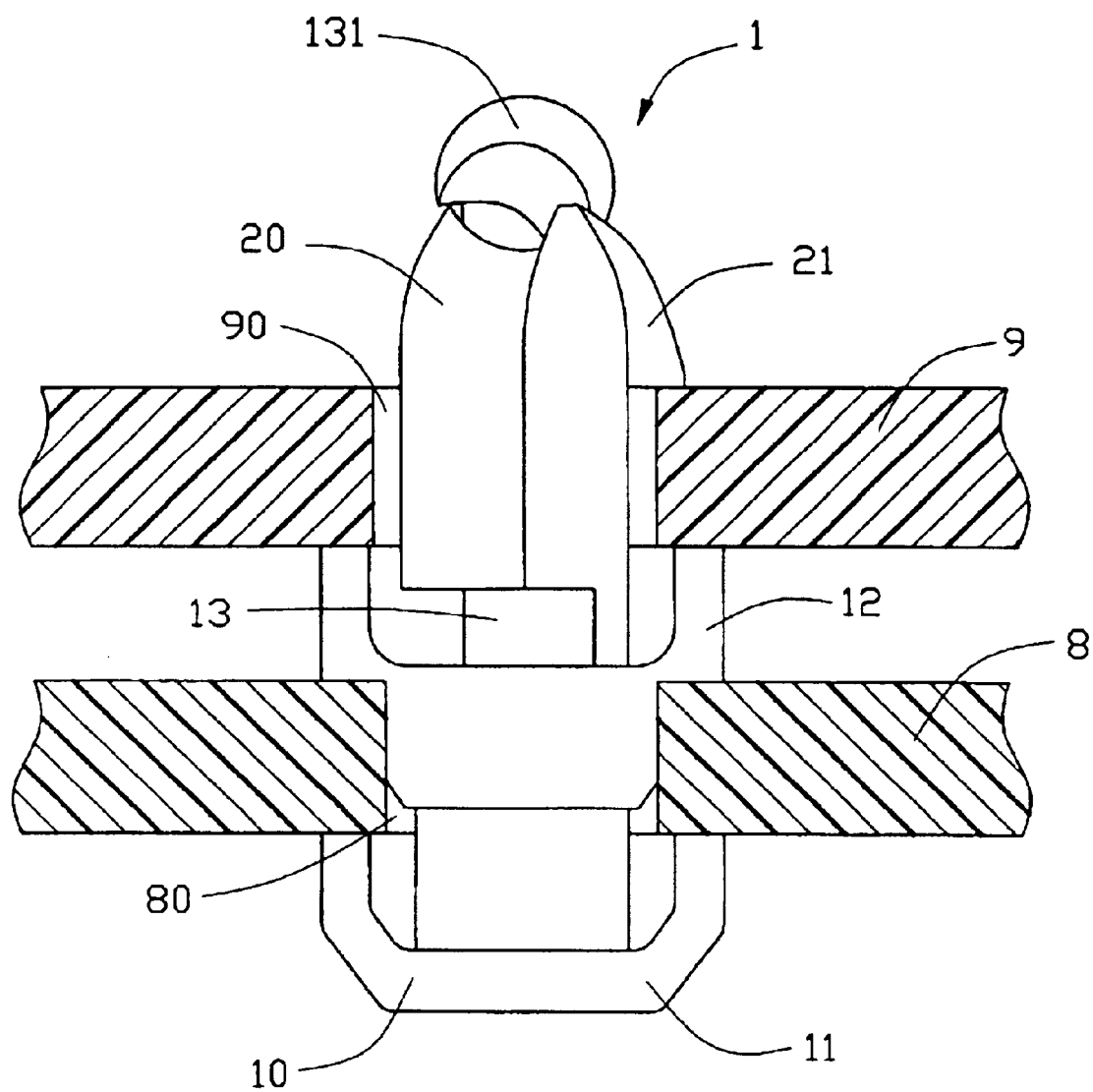
FIG. 3 is a partially cross-sectional view of FIG. 2.

With reference to FIGS. 1–3, a board holddown 1 for fastening a first and a second circuit boards 8, 9, comprises a molded, elastomeric support member 10 and a molded, bullet-shape member 20 of more rigid material than the support member 10, such as plastic material.

The elastomeric support member 10 includes a lower/first mounting portion 11, an upper/second mounting portion 12, an elongate, thin neck 13 extending upwardly from the second mounting portion 12, and an intermediate portion 14 connecting the first and second mounting portions 11, 12. The lower/first mounting portion 11 is configured in a general "U" shape in the cross-section thereof and comprises a pair of opposite first walls 110. Each first wall 110 has a mounting face 112 for supporting the first circuit board 8 and a tapered outer surface 114 for facilitating insertion through a through-hole 80 of the first circuit board 8. The upper/second mounting portion 12 has a shape similar to the lower/first mounting portion 11 and comprises a pair of opposite second walls 120 extending along a same direction as the first walls 110. Each second wall 120 has a mounting face 122 for supporting the second circuit board 9 and an opposing retaining face 124 facing to the mounting face 112 of the first wall 110. The retaining faces 124 cooperate with the mounting faces 112 of the first walls 11 to secure the first circuit board 8 therebetween.

The plastic, bullet-shape member 20 is assembled to the elongate, thin neck 13 via an overholding process with a cutout around a range of angle, and comprises a latch 21 formed adjacent to a hemispherical head 131 of the elongate, thin neck 13. The bullet-shape member 20 further removed some portions thereof around a root section to expose the inner neck and substantially diametrically opposite to the latch 21 so as to allow easy bending or deflection of the neck 13 in a direction opposite to the latch 13. In use, the second circuit board 9 is attached to the board holddown 1 from a top side and fastened between the second mounting portion 12 and the latch 21 with the mounting faces 122 abutting thereagainst. As known to one in the art, the elastomeric material can provide substantial resilience so that the elongate, thin neck 13 acts as a spring or a pivot when the second circuit board 9 is detached from the board holddown 1 by pushing the latch 21 away from its holding position. When the elongate, thin neck 13 is pushed through the plastic, bullet-shape member 20, it will have a slight sideward pull/tension to ensure that when the second circuit board 9 is removed therefrom, it will resiliently return to its original position.

It should be noted here that the hard plastic, bullet-shape member 20 prevents the board holddown 1 from damages when the board holddown passes by sharp edges of through-holes 80, 90 of the first and second circuit boards 8, 9.

Compared with the prior art, the present invention provides such a board holddown 1 that firmly holds a first circuit board 8 thereon while detachably, securely holds a second circuit board 9. The second circuit board 9 can be easily detached from the board holddown 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A board holddown for fastening circuit boards comprising:
   an elastomeric support member comprising a first mounting portion for supporting a first circuit board, a second mounting portion for supporting a second circuit board, an intermediate portion connecting the first and second mounting portions, and a neck projecting from the second mounting portion; and
   a plastic bullet-shape member being integrally formed to the neck and comprising a latch, the latch cooperating with the second mounting portion for detachably retaining the second circuit board therebetween;
   wherein the first mounting portion is insert through a first mounting hole of the first circuit board; and
   wherein the bullet-shape member is insert through a second mounting of the second circuit board; and
   wherein the neck has substantial resilience which acts as a spring or a pivot when the second circuit board is detached from the board holddown by pushing the latch of the plastic bullet-shape member away from its holding position.

2. The board holddown as described in claim 1, wherein the first mounting portion comprises a tapered outer surface for facilitating engaging with the first circuit board.

3. The board holddown as described in claim 1, wherein the neck has a hemispherical head.

4. The board holddown as described in claim 1, wherein the first and the second mounting portions each have a general "U" shape cross-section.

5. A board holddown assembly comprising:
   a board holddown including:
      an elastomeric support member defining spaced circumferential first mounting portion and second mounting portion connected by an axial intermediate portion;
      a neck extending from the second mounting portion away from the first mounting portion;
      a plastic bullet-shape member integrally formed to the neck and defining a radial extending latch around an upper portion thereof within a range of angle;
   a first type printed circuit board snugly sandwiched between the first mounting portion and the second mounting portion; and
   a second type printed circuit board snugly sandwiched between the second mounting portion and the latch; wherein
   said second type printed circuit board is more frequently released from or attached to the board holddown than said first type print circuit board;
   wherein the first mounting portion is insert through a first mounting hole of the first circuit board; and
   wherein the bullet-shape member is insert through a second mounting of the second circuit board; and
   wherein the neck has substantial resilience which acts as a spring or a pivot when the second circuit board is detached from the board holddown by pushing the latch of the plastic bullet-shape member away from its holding position.

6. The assembly as described in claim 5, wherein a portion of a root portion of said bullet-shape member is removed to expose the inner neck, said portion being substantially diametrically opposite to the latch for easy deflection of the neck in a direction opposite to the latch.

\* \* \* \* \*